United States Patent
Lehtola

(10) Patent No.: US 9,923,523 B2
(45) Date of Patent: Mar. 20, 2018

(54) DOHERTY POWER AMPLIFIER HAVING REDUCED SIZE

(71) Applicant: SKYWORKS SOLUTIONS, INC., Woburn, MA (US)

(72) Inventor: Philip John Lehtola, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/043,555

(22) Filed: Feb. 13, 2016

(65) Prior Publication Data

US 2016/0248384 A1    Aug. 25, 2016

Related U.S. Application Data

(60) Provisional application No. 62/116,453, filed on Feb. 15, 2015.

(51) Int. Cl.

| | |
|---|---|
| H03F 1/02 | (2006.01) |
| H03F 3/21 | (2006.01) |
| H03F 1/22 | (2006.01) |
| H03F 1/56 | (2006.01) |
| H03F 3/191 | (2006.01) |
| H03F 3/24 | (2006.01) |
| H03F 3/72 | (2006.01) |

(52) U.S. Cl.
CPC ......... *H03F 1/0288* (2013.01); *H03F 1/0211* (2013.01); *H03F 1/22* (2013.01); *H03F 1/565* (2013.01); *H03F 3/191* (2013.01); *H03F 3/211* (2013.01); *H03F 3/245* (2013.01); *H03F 3/72* (2013.01); *H03F 2200/111* (2013.01); *H03F 2200/451* (2013.01); *H03F 2203/21142* (2013.01); *H03F 2203/21157* (2013.01); *H03F 2203/7209* (2013.01)

(58) Field of Classification Search
CPC ............. H03F 1/0288; H03F 1/07; H03F 1/30
USPC ...................... 330/295, 124 R, 297
See application file for complete search history.

(56) References Cited

U.S. PATENT DOCUMENTS

| | | | | |
|---|---|---|---|---|
| 8,106,711 | B2 * | 1/2012 | Adamski | H03F 1/0216 330/124 R |
| 8,538,355 | B2 * | 9/2013 | Stockert | H03F 1/0227 330/282 |
| 9,209,758 | B2 * | 12/2015 | Briffa | H03G 3/3042 |
| 9,467,095 | B2 * | 10/2016 | Langer | H03F 1/0227 |

(Continued)

FOREIGN PATENT DOCUMENTS

JP    2008206106 A    9/2008

OTHER PUBLICATIONS

International Search Report and Written Opinion for PCT/US2016/017916 dated Jun. 17, 2016.

*Primary Examiner* — Henry Choe
(74) *Attorney, Agent, or Firm* — Chang & Hale LLP

(57) ABSTRACT

Doherty power amplifier having reduced size. In some embodiments, a power amplification system can include a supply system configured to provide a high-voltage supply signal, and a Doherty power amplifier configured to receive the high-voltage supply signal and amplify a radio-frequency (RF) signal. The power amplification system can further include an output path configured to receive and route the amplified RF signal to a filter. The output path can be substantially free of an impedance transformation circuit.

18 Claims, 12 Drawing Sheets

(56) References Cited

U.S. PATENT DOCUMENTS

| | | |
|---|---|---|
| 2010/0079210 A1 | 4/2010 | Yamauchi et al. |
| 2010/0301947 A1 | 12/2010 | Fujioka et al. |
| 2012/0299659 A1 | 11/2012 | Sankalp et al. |
| 2014/0035677 A1 | 2/2014 | Chen et al. |
| 2016/0094192 A1* | 3/2016 | Khesbak ............ H04B 1/0475 455/73 |

* cited by examiner

DOHERTY POWER AMPLIFIER HAVING REDUCED SIZE

CROSS-REFERENCE TO RELATED APPLICATION(S)

This application claims priority to U.S. Provisional Application No. 62/116,453 filed Feb. 15, 2015, entitled DOHERTY POWER AMPLIFIER HAVING REDUCED SIZE, the disclosure of which is hereby expressly incorporated by reference herein in its entirety.

BACKGROUND

Field

The present disclosure relates to power amplifiers for radio-frequency (RF) applications.

Description of the Related Art

In many radio-frequency (RF) applications, an RF signal to be transmitted is typically amplified by a power amplifier. Such a power amplifier can be implemented in a number of ways, including, for example, a Doherty power amplifier.

SUMMARY

According to some implementations, the present disclosure relates to a power amplification system that includes a supply system configured to provide a high-voltage (HV) supply signal, and a Doherty power amplifier (PA) configured to receive the HV supply signal and amplify a radio-frequency (RF) signal. The power amplification system further includes an output path configured to receive and route the amplified RF signal to a filter. The output path is substantially free of an impedance transformation circuit.

In some embodiments, the supply system can include a boost DC/DC converter configured to generate the HV supply signal based on a battery voltage Vbatt. The HV supply signal can be selected such that impedances of the Doherty PA and the filter match sufficiently to allow the output path to be substantially free of the impedance transformation circuit. The impedance of the Doherty PA can have a value of, for example, approximately 50 Ohms.

In some embodiments, the Doherty PA can includes a heterojunction bipolar transistor (HBT). The HBT can be a gallium arsenide (GaAs) device. The HV supply signal can be provided to a collector of the HBT as Vcc.

In some embodiments, the filter can be a transmit (Tx) filter configured to operate in a corresponding Tx frequency band. The Tx filter can be part of a duplexer configured to operate in the Tx frequency band and a corresponding receive (Rx) frequency band.

In some embodiments, the power amplification system can further include one or more additional Doherty PAs, with each configured to receive the HV supply signal and amplify an RF signal. The power amplification system can further include an output path configured to receive and route the amplified RF signal for each of the one or more additional Doherty PAs to a corresponding filter. The additional output path can be substantially free of an impedance transformation circuit.

In some embodiments, each filter can have associated with it a corresponding Doherty PA. The power amplification system can be substantially free of a band selection switch between the Doherty PAs and the filters. The power amplification system can have a lower loss than another power amplifier system having similar band handling capability but in which the PAs are operated in low voltage.

In some teachings, the present disclosure relates to a radio-frequency (RF) module that includes a packaging substrate configured to receive a plurality of components, and a power amplification system implemented on the packaging substrate. The power amplification system includes a supply system configured to provide a high-voltage (HV) supply signal, and a Doherty power amplifier (PA) configured to receive the HV supply signal and amplify an RF signal. The power amplification system further includes an output path configured to receive and route the amplified RF signal to a filter. The output path is substantially free of an impedance transformation circuit.

In some embodiments, the RF module can be a front-end module (FEM). In some embodiments, the power amplification system can be substantially free of a band selection switch between the Doherty PA and the filter. The power amplification system can have a lower loss than another power amplifier system having similar band handling capability but in which a Doherty PA is operated in low voltage. The RF module can have an area that is significantly less than another RF module having an amplification system with an impedance transformation circuit and a band selection switch.

In accordance with a number of implementations, the present disclosure relates to a wireless device having a transceiver configured to generate a radio-frequency (RF) signal, and a front-end module (FEM) in communication with the transceiver. The FEM includes a packaging substrate configured to receive a plurality of components, and a power amplification system implemented on the packaging substrate. The power amplification system includes a supply system configured to provide a high-voltage (HV) supply signal, and a Doherty power amplifier (PA) configured to receive the HV supply signal and amplify a radio-frequency (RF) signal. The power amplification system further includes an output path configured to receive and route the amplified RF signal to a filter. The output path is substantially free of an impedance transformation circuit. The wireless device further includes an antenna in communication with the FEM and configured to transmit the amplified RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
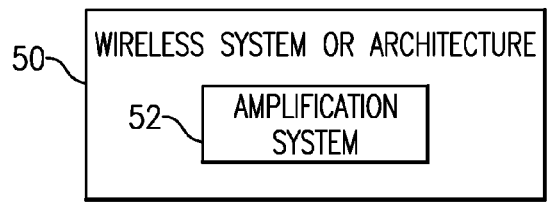
FIG. 1 shows a wireless system or architecture that includes an amplification system.

Introduction:

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
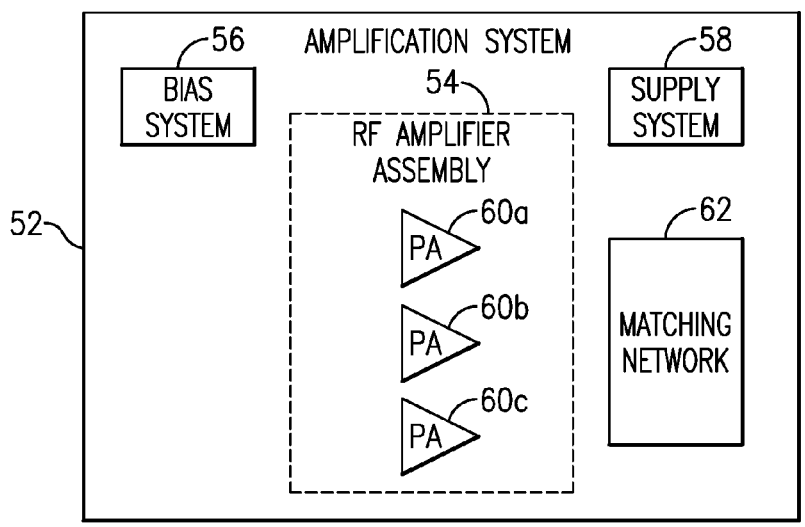
FIG. 2 shows that the amplification system of FIG. 1 can include a radio-frequency (RF) amplifier assembly having one or more power amplifiers (PAs).

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Figures 3A, 3B, 3C:
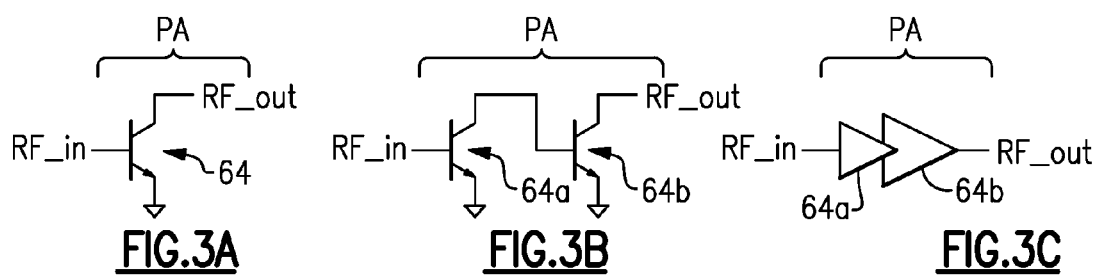
FIGS. 3A-3E show examples of how the PA of FIG. 2 can be configured.

For the purpose of description, it will be understood that each PA (60) of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figures 3D, 3E:
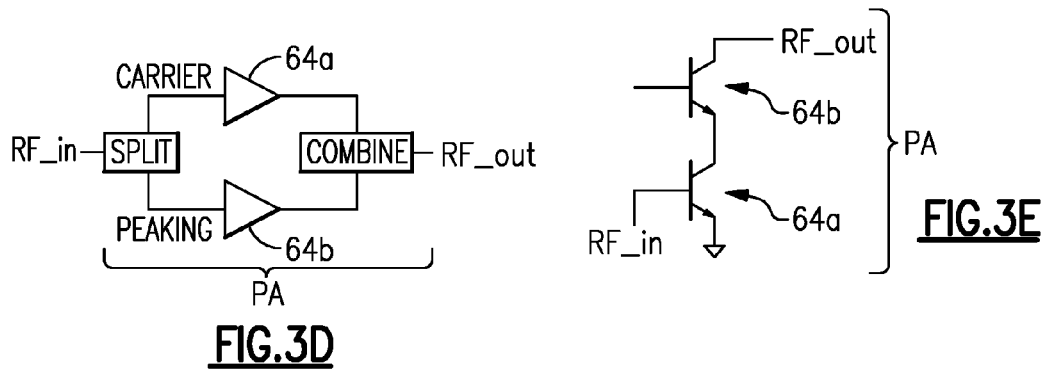

FIG. 3D shows that in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Figure 4:
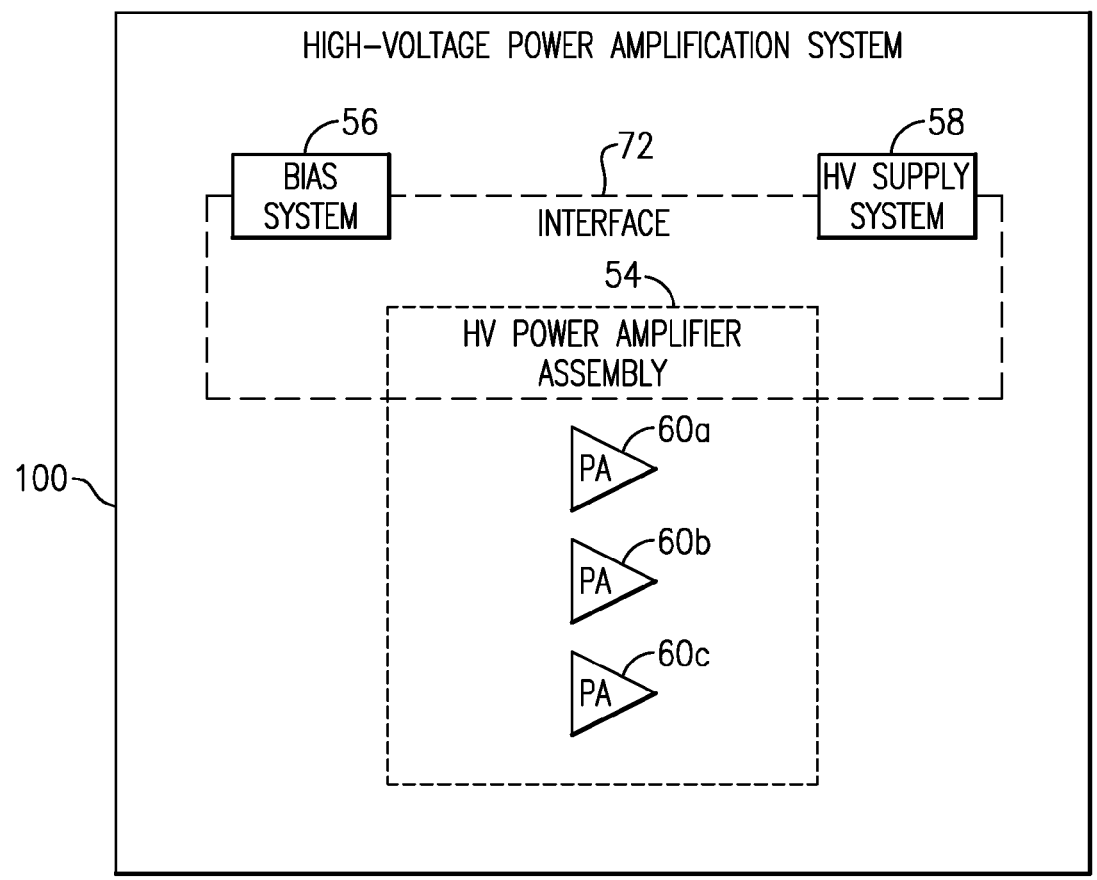
FIG. 4 shows that in some embodiments, the amplification system of FIG. 2 can be implemented as a high-voltage (HV) power amplification system.

FIG. 4 shows that in some embodiments, the amplification system 52 of FIG. 2 can be implemented as a high-voltage (HV) power amplification system 100. Such a system can include an HV power amplifier assembly 54 configured to include HV amplification operation of some or all of the PAs (e.g., 60a-60c). As described herein, such PAs can be biased by a bias system 56. In some embodiments, the foregoing HV amplification operation can be facilitated by an HV supply system 58. In some embodiments, an interface system 72 can be implemented to provide interface functionalities between the HV power amplifier assembly 54 and either or both of the bias system 56 and the HV supply system 58.

Examples Related to HV Systems:

Many wireless devices such as cellular handsets are configured to support multiple frequency bands; and such devices typically require complex power amplification architectures. However, such complexity in power amplification architectures can result in degradation of transmit efficiency as the number of supported bands increases. Such a degradation in efficiency is typically largely due to increased loss incurred by combining of multiple frequency bands while maintaining competitive size and cost targets.

Some wireless systems can include power amplifiers (PAs) configured in a Doherty configuration. Such a configuration typically includes separate amplification paths for carrier and peaking portions of an RF signal. Such a signal is split into the two amplification path, and the separately amplified carrier and peaking portions are combined to generate an amplified output signal.

Figure 5:
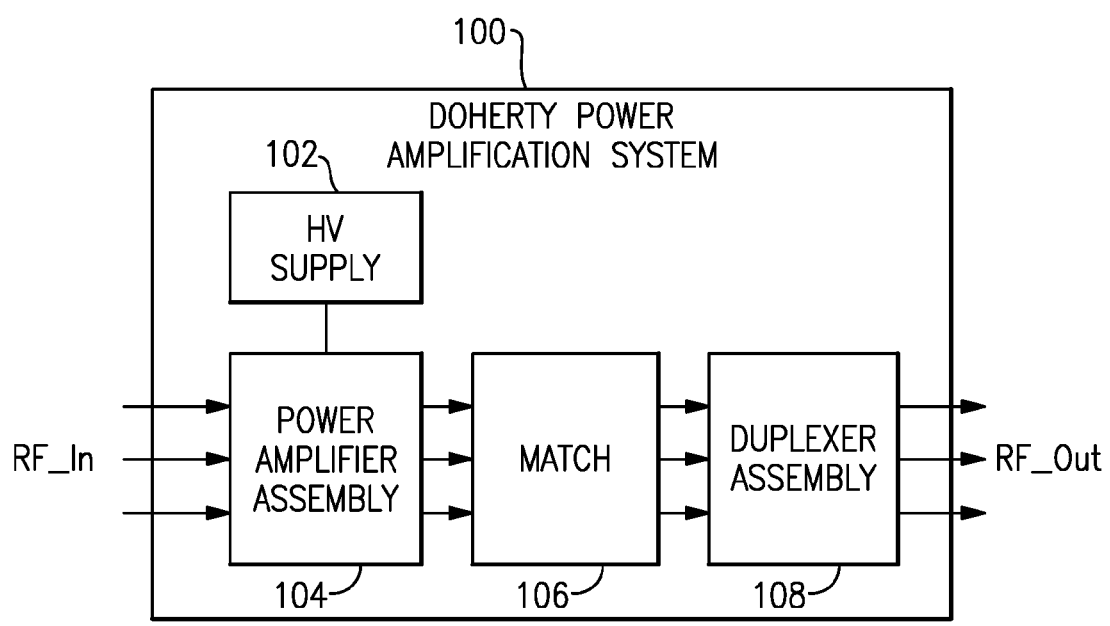
FIG. 5 shows that in some embodiments, the HV power amplification system of FIG. 4 can be configured as a Doherty power amplification system.

Described herein are examples of systems, circuits, devices and methods that can provide advantageous features for Doherty PAs. Such advantageous features can include, for example, significantly reduce loss while maintaining or improving competitive levels of size and/or cost. FIG. 5 shows that in some embodiments, the HV power amplification system 100 of FIG. 4 can be configured as a Doherty power amplification system. In some embodiments, such a Doherty power amplification system can include high-voltage operation capability.

Doherty power amplification architectures can offer significant advantages for transmit efficiency with moderated peak-average waveforms. However, physical implementation of such architectures typically involves increased passive component content to provide functionalities such as phase shifting and impedance transformation networks at the amplifier output.

As described herein, a Doherty power amplification architecture can utilize a boost converter to increase the amplifier supply voltage to a level that allows amplifier operation at, for example, a 50 ohm impedance without impedance transformation networks. Such an architecture can allow, for example, significant simplification and integration of passive component content with a system bill of materials (BOM) comparable to a single ended amplification configuration.

In the example of FIG. 5, an HV Doherty power amplification system 100 can include a power amplifier assembly 104 having one or more PAs configured to amplify one or more RF signals (RF_In). Such amplified RF signal(s) can be routed to a duplexer assembly 108 having one or more duplexers, through a match component 106 having one or more matching circuits.

The duplexer(s) can allow duplexing of transmit (Tx) and receive (Rx) operations. The Tx portion of such duplexing operations is depicted as one or more amplified RF signals (RF_Out) being output from the duplexer assembly 108 for transmission through an antenna (not shown). In the example of FIG. 5, the Rx portion is not shown; however, received signals from an antenna can be received by the duplexer assembly 108 and output to, for example, low-noise amplifiers (LNAs).

In the example of FIG. 5, an HV supply system 102 is shown to provide one or more HV supply signals to the power amplifier assembly 104. More specific examples of how such HV signal(s) can be provided to corresponding PA(s) are described herein in greater detail.

In some embodiments, the HV Doherty power amplification system 100 of FIG. 5 can utilize high-voltage capability of some PAs such as, for example, gallium arsenide (GaAs) heterojunction bipolar transistor (HBT) PAs. It will be understood that one or more features of the present disclosure can also be implemented with other types of PAs. For example, amplification systems utilizing CMOS devices with LDMOS multiple cascode stages, silicon bipolar devices, and GaN/HEMT devices can also benefit from operation in high-voltage regions.

With such HV operation of PAs, one or more lossy components can be eliminated from an amplification system. For example, PA output matching network(s) can be eliminated. In another example, PA supply efficiency can be increased. In yet another example, some passive components can be removed. Examples related to the foregoing are described herein in greater detail.

One or more of the foregoing features associated with HV operation can result in one or more die being implemented in smaller dimensions, thereby allowing greater flexibility in power amplification system designs. For example, a power amplification system can be implemented with an increased number of relatively small PAs, to thereby allow elimination of lossy components such as band switches. Examples related to such elimination of band switches are described herein in greater detail.

For the purpose of description, it will be understood that high-voltage (HV) can include voltage values that are higher than a battery voltage utilized in portable wireless devices. For example, an HV can be greater than 3.7V or 4.2V. In some situations, an HV can include voltage values that are greater than a battery voltage and at which portable wireless devices can operate more efficiently. In some situations, an HV can include voltage values that are greater than a battery voltage and less than a breakdown voltage associated with a given type of PA. In the example context of GaAs HBT, such a breakdown voltage can be in a range of 15V to 25V. Accordingly, an HV for GaAs HBT PA can be in a range of, for example, 3.7V to 25V, 4.2V to 20V, 5V to 15V, 6V to 14V, 7V to 13V, or 8V to 12V.

Figure 6:
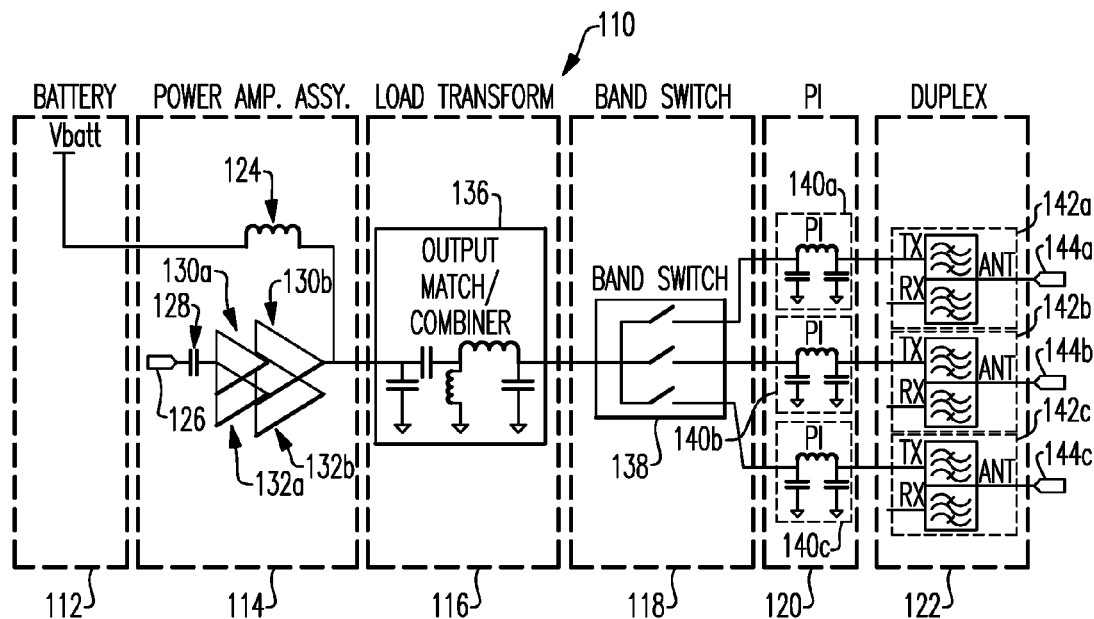
FIG. 6 shows an example of a traditional Doherty power amplification system.
Figure 7:
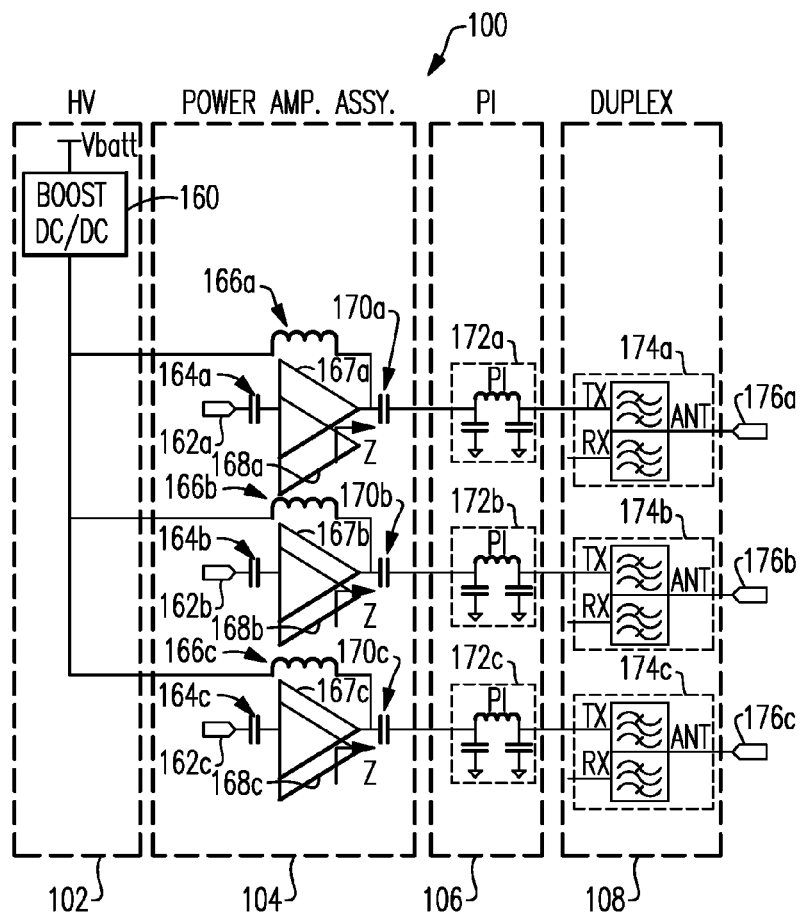
FIG. 7 shows an example of a Doherty power amplification system having one or more features as described herein.

FIGS. 6 and 7 show a comparison between a traditional Doherty power amplification system 110 (FIG. 6) and a high-voltage (HV) Doherty power amplification system 100 (FIG. 7) to demonstrate how some lossy components can be substantially eliminated in the HV Doherty power amplification system 100. For the purpose of comparison, it will be assumed that each power amplification system is configured to provide amplification for three frequency bands. However, it will be understood that more or less numbers of frequency bands can be utilized.

In the example of FIG. 6, the traditional Doherty power amplification system 110 is shown to include a power amplifier assembly 114 having a broadband carrier amplification path 130 and a broadband peaking amplification path 132 capable of providing amplification for three frequency bands. In the example, each of the carrier and peaking amplification paths 130, 132 is shown to include two stages (e.g., a driver stage (130*a* or 132*a*) and an output stage (130*b* or 132*b*)); however, it will be understood that there may be other number of stage(s).

The foregoing amplification paths 130, 132 can receive an input RF signal through a common input node 126, and such an RF signal can be routed through, for example, a DC-block capacitance 128, and be split into the carrier amplification path 130 and the peaking amplification path 132. In some embodiments, each of the amplification stages 130a, 130b, 132a, 132b can include, for example, HBT or CMOS amplification transistors.

In the example of FIG. 6, the collector of the output stage 130b is shown to be provided with a supply voltage VCC from a battery voltage source (Vbatt) through a choke inductance 124.

When the power amplifier assembly is operated in the foregoing manner, impedance transformation typically needs to occur to match the impedance of the PAs with impedance associated with a downstream component. In the example of FIG. 6, a band switch 138 (depicted as being part of a band switch system 118) that receives the output of the power amplifier assembly 114 is typically configured as a 50Ω load. Accordingly, an impedance transformation to yield such an impedance load of 50Ω needs to be implemented. In the example of FIG. 6, such an impedance transformation is shown to be implemented by an output matching network (OMN) 136 which is depicted as being part of a load transform system 116.

In the example of FIG. 6, the band switch 138 is depicted as having a single input from the output of the power amplifier assembly 114 (through the OMN 136), and three outputs corresponding to three example frequency bands. Three duplexers 142a-142c are shown to be provided for such three frequency bands.

Each of the three duplexers 142a-142c is shown to include TX and RX filters (e.g., bandpass filters). The TX filter is shown to be coupled to the band switch 138 to receive the amplified and switch-routed RF signal for transmission. Such an RF signal is shown to be filtered and routed to an antenna port (ANT) (144a, 144b or 144c). The RX filter is shown to receive an RX signal from the antenna port (ANT) (144a, 144b or 144c). Such an RX signal is shown to be filtered and routed to an RX component (e.g., an LNA) for further processing.

It is typically desirable to provide impedance matching between a given duplexer and a component that is upstream (in the TX case) or downstream (in the RX case). In the example of FIG. 6, the band switch 138 is such an upstream component for the TX filter of the duplexer. Accordingly, matching circuits 140a-140c (depicted as being parts of a PI network 120) are shown to be implemented between the respective outputs of the band switch 138 and the respective duplexers 142a-142c. In some embodiments, each of such matching circuits 140a-140c can be implemented as, for example, a pi-matching circuit.

Table 1 lists example values of insertion loss and efficiency for the various components of the Doherty power amplification system 110 of FIG. 6. It will be understood that the various values listed are approximate values.

TABLE 1

| Component | Insertion loss | Efficiency |
| --- | --- | --- |
| Power Amp. Assy. (114) | N/A | 60% to 65% (PAE) |
| Load Transform (116) | 0.5 dB to 0.7 dB | 85% to 89% |
| Band Switch (118) | 0.3 dB to 0.5 dB | 89% to 93% |
| PI (120) | 0.3 dB | 93% |
| Duplex (122) | 2.0 dB | 63% |

From Table 1, one can see that the Doherty power amplification system 110 of FIG. 6 includes a significant number of loss contributors. Even if each component of the system 110 is assumed to operate at its upper limit of efficiency, the total efficiency of the ET power amplification system 110 is approximately 32% (0.65×0.89×0.93×0.93×0.63).

In the example of FIG. 7, the HV Doherty power amplification system 100 is depicted as being configured to provide amplification for the same three frequency bands as in the Doherty power amplification system 110 of FIG. 6. In a power amplifier assembly 104, three separate amplification paths can be implemented, such that each amplification path provides amplification for its respective frequency band(s). For example, the first amplification path is shown to include a first Doherty PA (167a and 168a) which receives an RF signal from an input node 162a through a DC-block capacitance 164a. The amplified RF signal is shown to be routed to a downstream component through a capacitance 170a. Similarly, the second amplification path is shown to include a second Doherty PA (167b and 168b) which receives an RF signal from an input node 162b through a DC-block capacitance 164b; and the amplified RF signal is shown to be routed to a downstream component through a capacitance 170b. Similarly, the third amplification path is shown to include a third Doherty PA (167c and 168c) which receives an RF signal from an input node 162c through a DC-block capacitance 164c; and the amplified RF signal is shown to be routed to a downstream component through a capacitance 170c.

In some embodiments, the Doherty PAs in the example of FIG. 7 can include, for example, HBT PAs. It will be understood that one or more features of the present disclosure can also be implemented with other types of PAs. For example, PAs that can be operated to yield impedances that match or are close to downstream components (e.g., by HV operation and/or through other operating parameter(s)) can be utilized to yield one or more of the benefits as described herein.

In the example of FIG. 7, each carrier PA (167a, 167b or 167c) can be provided with a supply voltage VCC from a boost DC/DC converter 160 through a choke inductance (166a, 166b or 166c). Similarly, each peaking PA (168a, 168b or 168c) can be provided with the supply voltage VCC from the boost DC/DC converter 160 through the choke inductance (166a, 166b or 166c). The boost DC/DC converter 160 is depicted as being part of an HV system 102. The boost DC/DC converter 160 can be configured to supply such a range of VCC voltage values (e.g., about 1V to 10V), including HV ranges or values as described herein. The boost DC/DC converter 160 is shown to generate such a high VCC voltage based on a battery voltage Vbatt.

When the Doherty PAs of the power amplifier assembly 104 are operated in the foregoing manner with high VCC voltage (e.g., at about 10V), impedance Z of each PA can be relatively high (e.g., about 40Ω to 50Ω); and thus, impedance transformation is not necessary to match with impedance associated with a downstream component and/or an upstream component. Accordingly, elimination or simplification of two impedance transformation networks can be realized. It is further noted that the Doherty PAs of the power amplifier assembly 104 can support very simple integration of, for example, a quarter-wave combining network.

In the example of FIG. 7, each of the duplexers 174a-174c (depicted as being parts of a duplex assembly 108) that receives the output of the corresponding Doherty PA is typically configured as a 50Ω load. Accordingly, and assuming that the impedance (Z) presented by the Doherty PA is about 50Ω, an impedance transformation (such as the load transform system 116 in FIG. 6) is not needed.

It is typically desirable to provide impedance matching between a given duplexer and a component that is upstream (in the TX case) or downstream (in the RX case). In the example of FIG. 7, the Doherty PA is such an upstream component for the TX filter of the duplexer (174a, 174b or 174c). Accordingly, matching circuits 172a-172c (depicted as being parts of a PI network 106) can be implemented between the respective outputs of the Doherty PAs and the respective duplexers 174a-174c. In some embodiments, each of such matching circuits 172a-172c can be implemented as, for example, a pi-matching circuit.

In the example of FIG. 7, the HV operation of the Doherty PAs can result in each of the Doherty PAs presenting an impedance Z that is similar to the impedance of the corresponding duplexer. Since impedance transformation is not needed in such a configuration, there is no need for an impedance transformer (116 in FIG. 6).

It is also noted that operation of the Doherty PAs at the higher impedance can result in much lower current levels within the PAs. Such lower current levels can allow the Doherty PAs to be implemented in significantly reduced die size(s).

In some embodiments, either or both of the foregoing features (elimination of impedance transformer and reduced PA die size) can provide additional flexibility in power amplification architecture design. For example, space and/or cost savings provided by the foregoing can allow implementation of a relatively small Doherty PA for each frequency band, thereby removing the need for a band switch system (e.g., 118 in FIG. 6). Accordingly, size, cost and/or complexity associated with the HV Doherty power amplification system 100 of FIG. 7 can be maintained or reduced when compared to the Doherty power amplification system 110 of FIG. 6, while significantly reducing the overall loss of the power amplification system 100.

Table 2 lists example values of insertion loss and efficiency for the various components of the HV Doherty power amplification system 100 of FIG. 7. It will be understood that the various values listed are approximate values.

TABLE 2

| Component | Insertion loss | Efficiency |
| --- | --- | --- |
| HV (102) | N/A | 93% |
| Power Amp. Assy. (104) | N/A | 75% to 80% (PAE) |
| PI (106) | 0.3 dB | 93% |
| Duplex (108) | 2.0 dB | 63% |

From Table 2, one can see that the HV Doherty power amplification system 100 of FIG. 7 includes a number of loss contributors. However, when compared to the Doherty power amplification system 110 of FIG. 6 and Table 1, two significant loss contributors (Load Transform (116) and Band Switch (118)) are absent in the HV Doherty power amplification system 100 of FIG. 7. Elimination of such loss contributors is shown to remove about 1 dB in the transmit path in the example of FIG. 7 and Table 2.

Also referring to Table 2, if each component of the system 100 is assumed to operate at its upper limit of efficiency (as in the example of Table 1), the total efficiency of the HV Doherty power amplification system 100 is approximately 44% (0.93×0.80×0.93×0.63). Even if each component is assumed to operate at its lower limit of efficiency, the total efficiency of the HV Doherty power amplification system 100 is approximately 41% (0.93×0.75×0.93×0.63). One can see that in either case, the total efficiency of the HV Doherty power amplification system 100 of FIG. 7 is significantly higher than the total efficiency (approximately 32%) of the Doherty power amplification system 110 of FIG. 6.

Referring to FIGS. 6 and 7, a number of features can be noted. It is noted that use of the DC/DC boost converter (160 in FIG. 7) can allow elimination of one or more other power converters that may be utilized in a PA system. When operated to yield an HV supply voltage (e.g., 10 VDC), 1 Watt ($(10V)^2/(2\times50\Omega)$) of RF power can be produced with no harmonic terminations. It is further noted that a PA driven as a 50Ω load (e.g., FIG. 7) results in a significantly lower loss per Ohm than a PA driven as a 3Ω load (e.g., FIG. 6).

Figure 8:
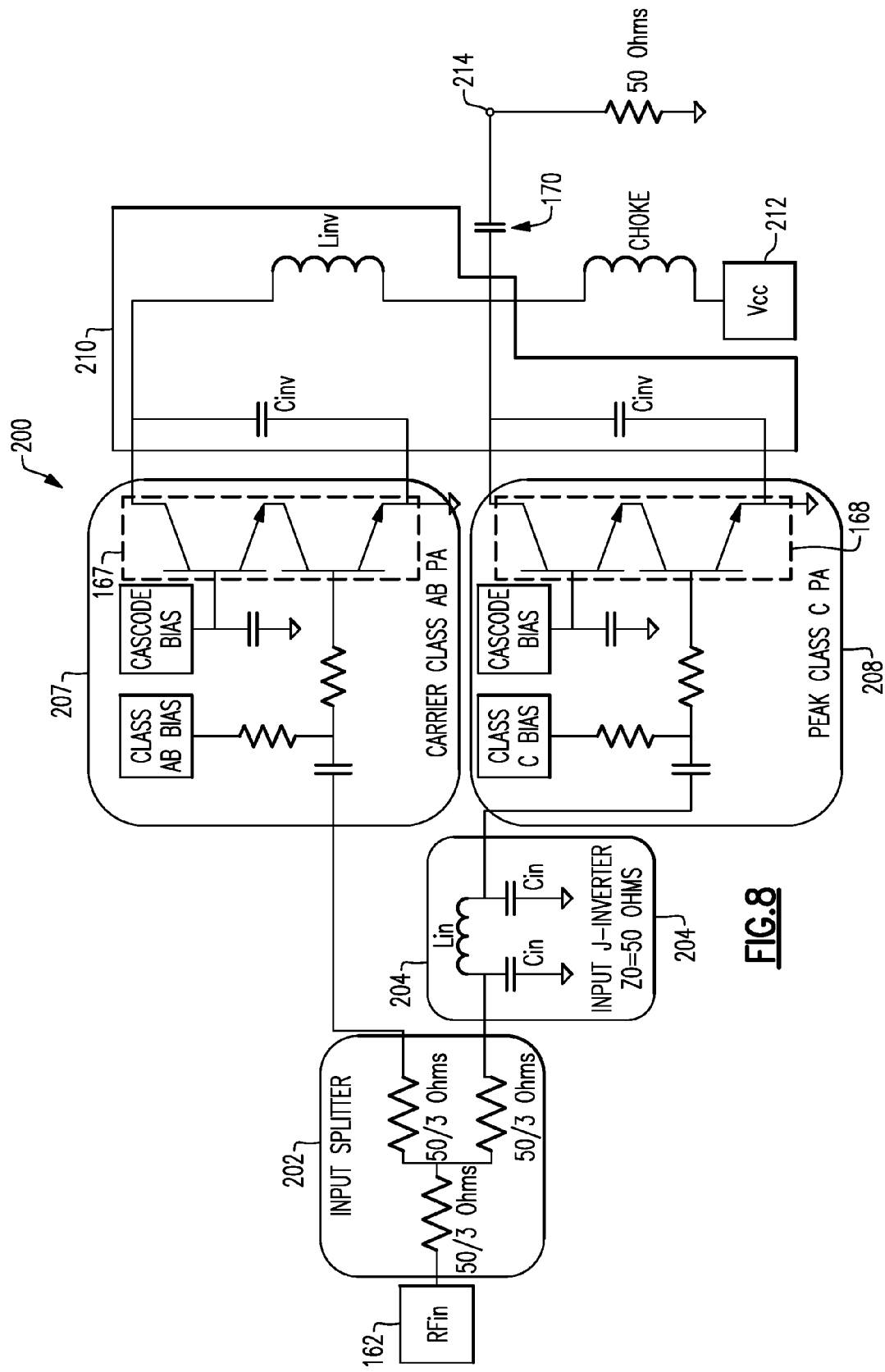
FIG. 8 shows an HV Doherty power amplification system that can be a more specific example of the HV Doherty power amplification system of FIG. 7.

FIG. 8 shows an HV Doherty power amplification system 100 that can be a more specific example of the HV Doherty power amplification system 100 of FIG. 7. In the example of FIG. 8, a power amplifier assembly can include a carrier PA 167 and a peaking PA 168. Each of the carrier and peaking PAs is depicted as having a cascode configuration.

In the example of FIG. 8, the carrier PA 167 can be operated with, for example, a Class AB bias; and the peaking PA 168 can be operated with, for example, a Class C bias. More particularly, the RF transistor of the carrier PA 167 is shown to be biased in a Class AB configuration; and the RF transistor of the peaking PA 168 is shown to be biased in a Class C configuration. The cascode transistor of each of the carrier and peaking PAs 167, 168 is shown to be biased by its respective cascode bias circuit.

In the example of FIG. 8, an RF signal can be received at a common input port 162 (RFin), and such a signal can be split into the carrier amplification path and the peaking amplification path by an input splitter 202. The carrier portion is shown to be provided to the carrier PA 167, and the peaking portion is shown to be provided to the peaking PA 168 through an input inverter 204.

In the example of FIG. 8, a supply voltage Vcc from a supply node 212 is shown to be provided to the collector of each cascode transistor of the carrier and peaking PAs 167, 168. More particularly, the collector of the cascode transistor of the carrier PA 167 is shown to be provided with Vcc through inductances indicated as Choke and Linv. The collector of the cascode transistor of the peaking PA 168 is shown to be provided with Vcc through Linv.

The collector of the cascode transistor of the carrier PA 167 is shown to be coupled to the emitter of the RF transistor of the carrier PA 167 through a corresponding capacitance Cinv. Similarly, the collector of the cascode transistor of the peaking PA 168 is shown to be coupled to the emitter of the RF transistor of the peaking PA 168 through a corresponding capacitance Cinv.

In the example of FIG. 8, an assembly of the capacitances Cinv and the inductance Linv can form an output J-inverter 210 having an impedance of, for example, approximately 100Ω. The amplified outputs of the carrier and peaking PAs 167, 168 can be combined by the output J-inverter 210, and the combined output can be provided to an output node 214 through a capacitance 170.

As shown in FIG. 8, the high impedance operation of the Doherty PAs can significantly simplify the Doherty amplification architecture, including the simplification of the combining network (e.g., the output J-inverter 210). In some embodiments, the carrier and peaking PAs 167, 168 can be implemented on a die. In some embodiments, the input splitter 202 and the input J-inverter 204 can also be implemented on the same die. In some embodiments, the inverter capacitances (Cinv) of the output J-inverter 210 can also be implemented on the same die. Accordingly, and assuming that the inverter inductance Linv is implemented as an external passive device, only one such additional passive device is needed when compared to a single-ended power amplification design.

Figure 9:
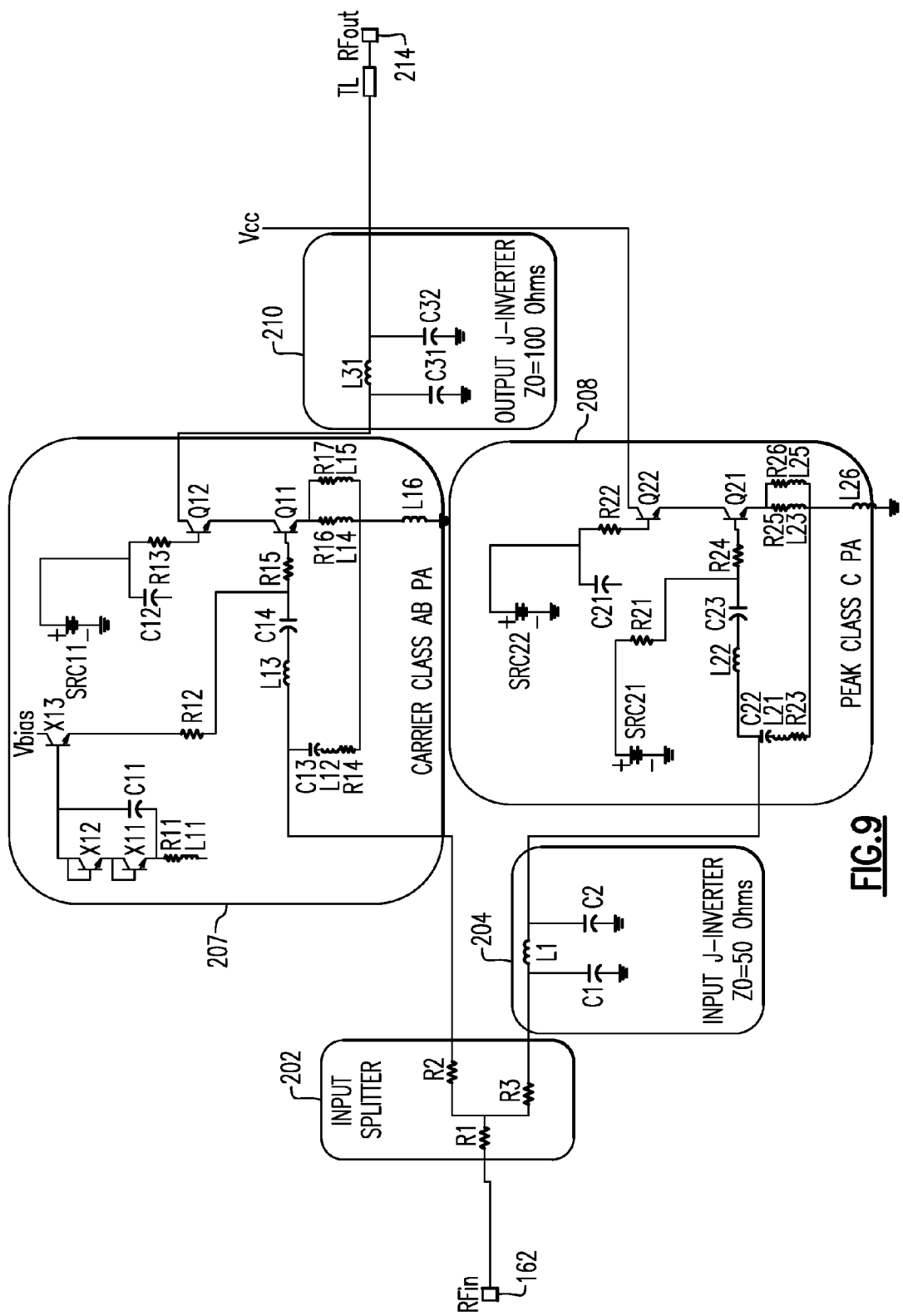
FIG. 9 shows an HV Doherty amplification system that can be a more specific example of the HV Doherty amplification system of FIG. 8.

FIG. 9 shows an HV Doherty amplification system that can be a more specific example of the HV Doherty amplification system of FIG. 8. In FIG. 9, reference numerals 202, 204, 207, 208 and 210 generally correspond to the same reference numerals of FIG. 8. In the example of FIG. 9, it will be understood that various values of circuit elements such as resistances, capacitances and inductances can be selected to achieve desired functionalities for one or more frequencies.

Figure 10:
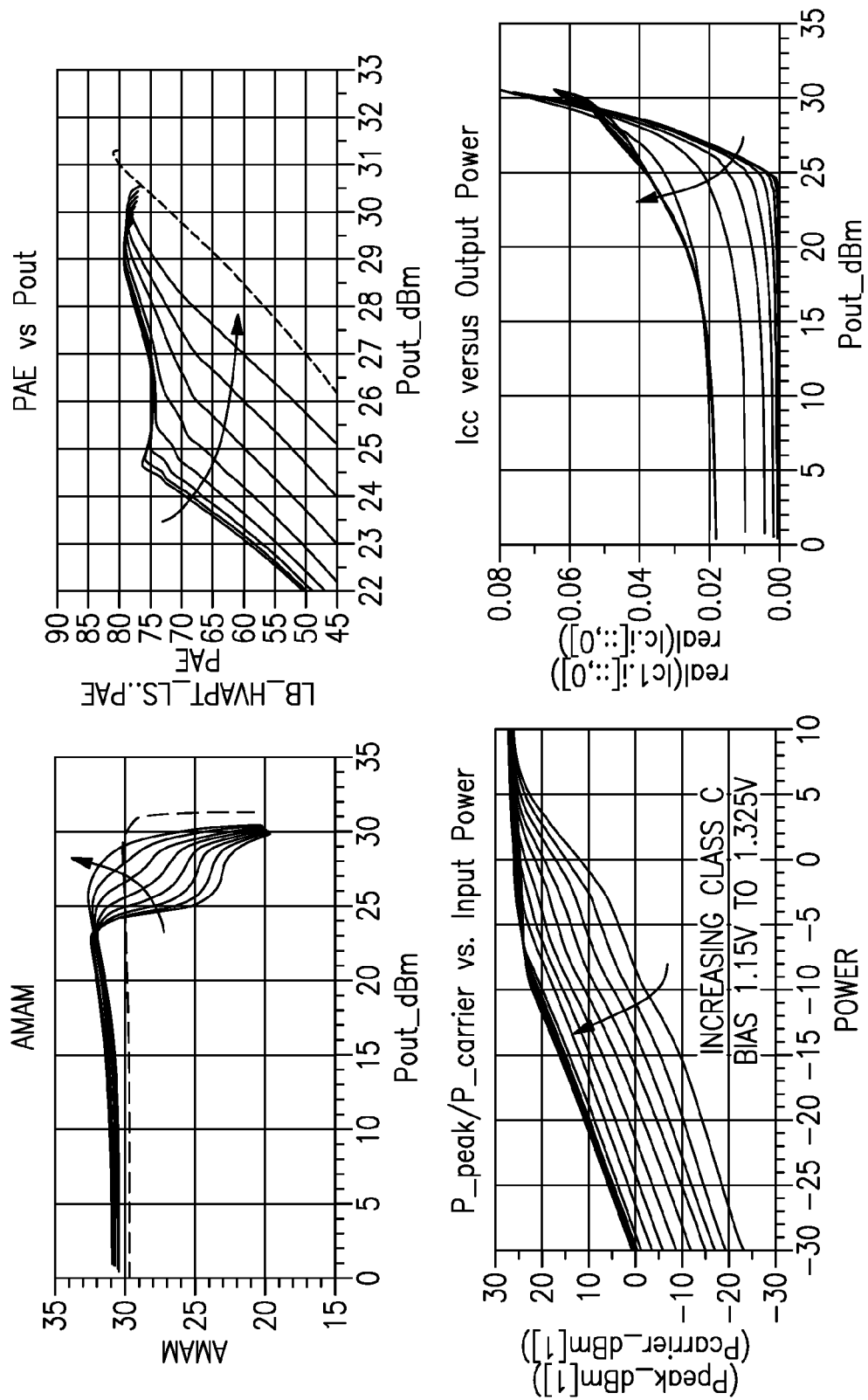
FIG. 10 shows plots of AMAM vs output power, PAE vs output power, ratio of peak power and carrier power vs input power, and collector current vs output power, as Class C bias point is swept, for the HV Doherty amplification system of FIG. 9.
Figure 11:
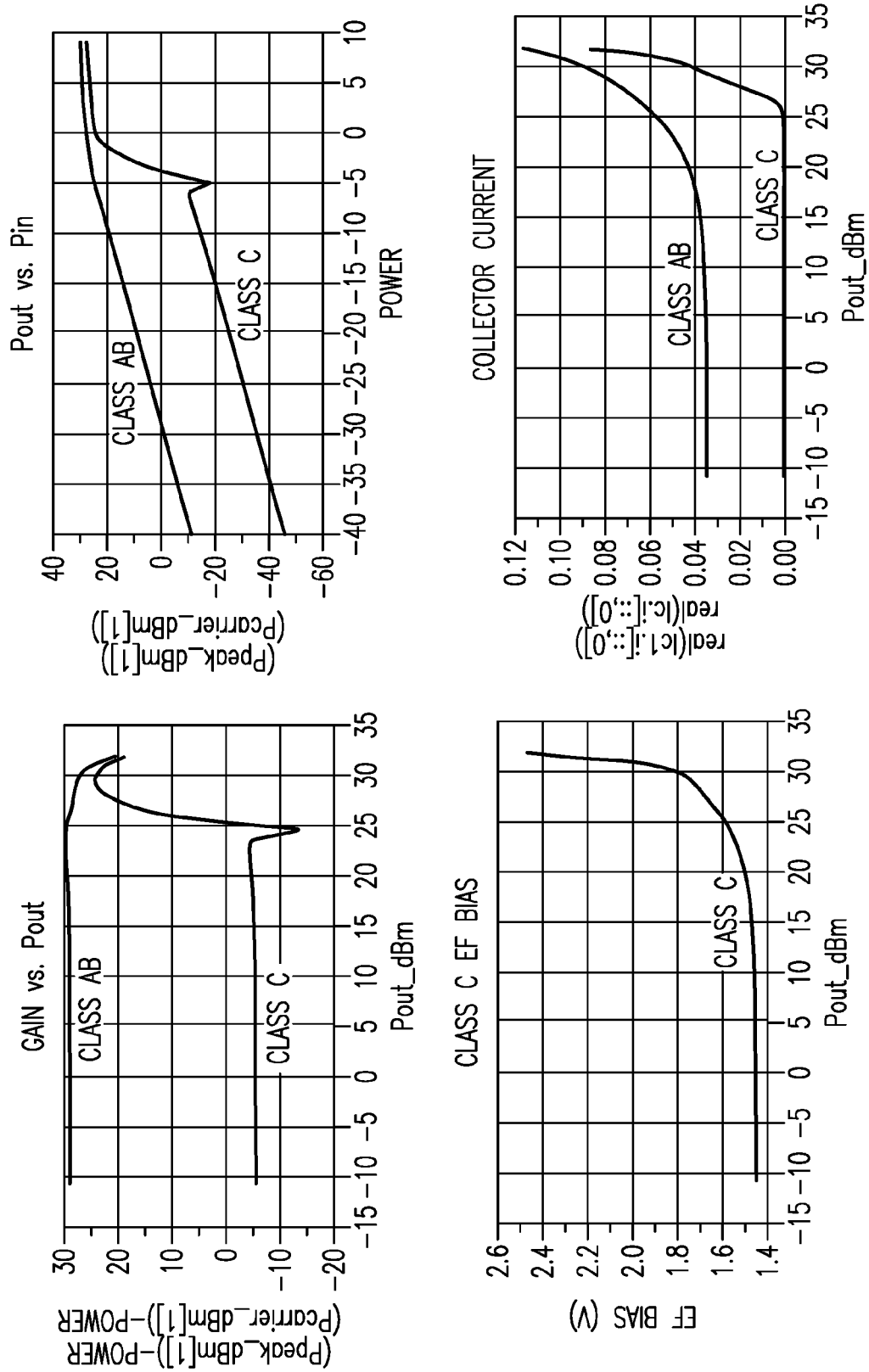
FIG. 11 shows gain, output power, emitter follower bias, and collector current characteristics for Class AB and Class C bias configurations associated with the HV Doherty amplification system of FIG. 9.
Figure 12:
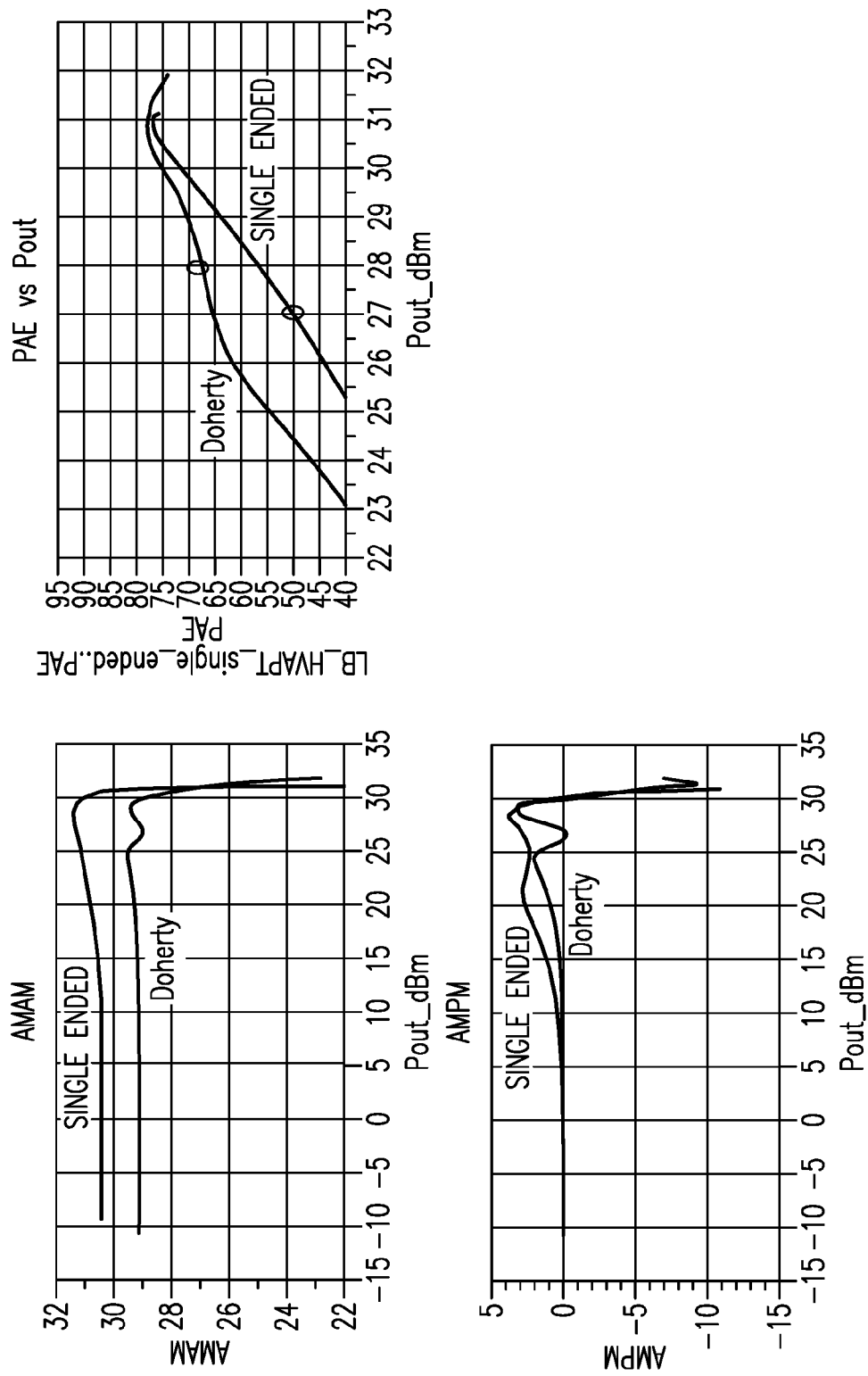
FIG. 12 shows AMAM, PAE, and AMPM characteristics for the HV Doherty amplification system if FIG. 9, as well as for a single ended amplification system.

FIGS. 10-12 show examples of performance characteristics of the HV Doherty amplification system of FIG. 9. More particularly, FIG. 10 shows plots of AMAM vs output power, PAE vs output power, ratio of peak power and carrier power vs input power, and collector current vs output power, as Class C bias point is swept.

FIG. 11 shows gain, output power, emitter follower bias, and collector current characteristics for Class AB and Class C bias configurations.

FIG. 12 shows AMAM, PAE, and AMPM characteristics for the HV Doherty amplification system, as well as for a single ended amplification system.

Figure 13:
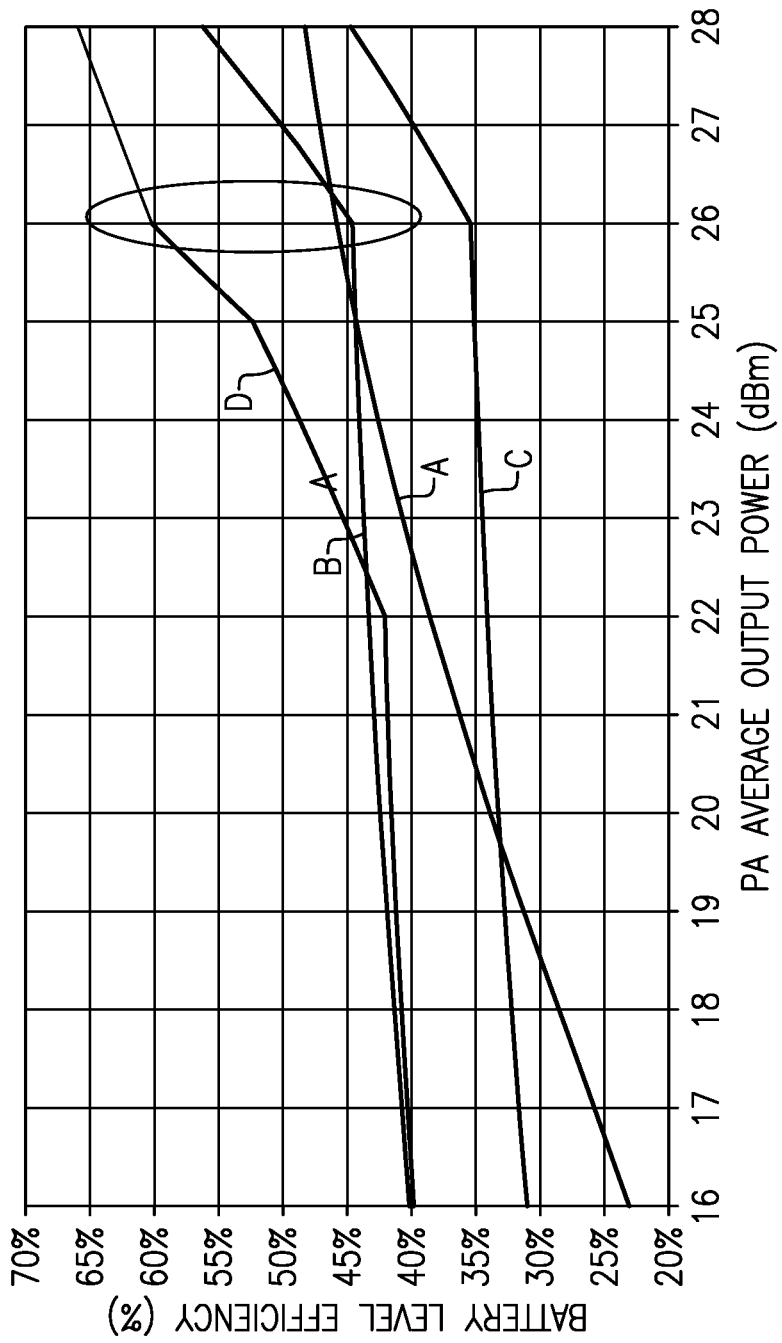
FIG. 13 shows examples of battery level efficiency as a function of average output power for a Buck ET amplification system, a boost average power tracking (APT) amplification system, a Buck APT amplification system, and a boost Doherty amplification system having one or more features as described herein.

FIG. 13 shows examples of battery level efficiency as a function of average output power for a Buck ET amplification system (A), a boost average power tracking (APT) amplification system (B), a Buck APT amplification system (C), and a boost Doherty amplification system (D) having one or more features as described herein. At an example output power of about 26 dBm, one can see that the boost Doherty amplification system (D) has an efficiency level that is about 15% greater than both of the Buck ET (A) and boost APT (B) systems, and about 25% greater than the Buck APT system (C).

Figure 14:
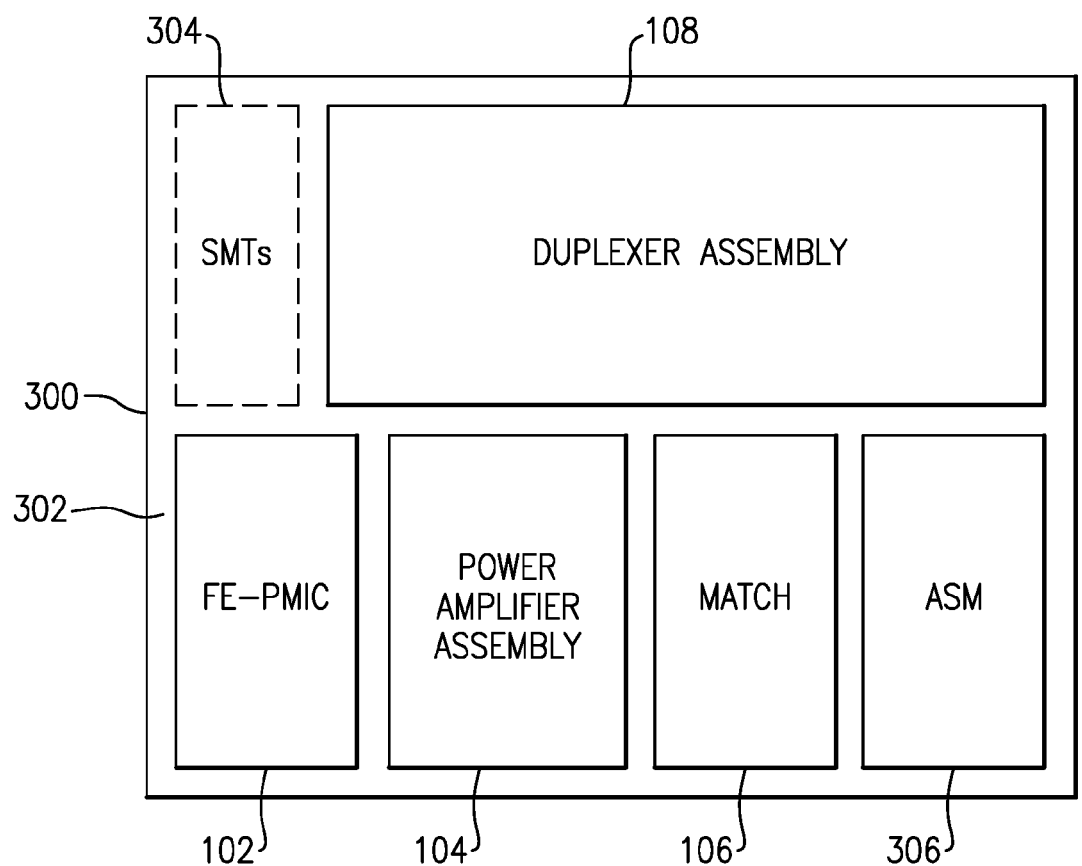
FIG. 14 shows that in some embodiments, some or all of an HV Doherty power amplification system having one or more features as described herein can be implemented in a module.

FIG. 14 shows that in some embodiments, some or all of an HV Doherty power amplification system having one or more features as described herein can be implemented in a module. Such a module can be, for example, a front-end module (FEM). In the example of FIG. 14, a module 300 can include a packaging substrate 302, and a number of components can be mounted on such a packaging substrate. For example, a front-end-power management integrated circuit (FE-PMIC) component 102, a power amplifier assembly 104, a match component 106, and a duplexer assembly 108 can be mounted and/or implemented on and/or within the packaging substrate 302. Other components such as a number of SMT devices 304 and an antenna switch module (ASM) 306 can also be mounted on the packaging substrate 302. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 15:
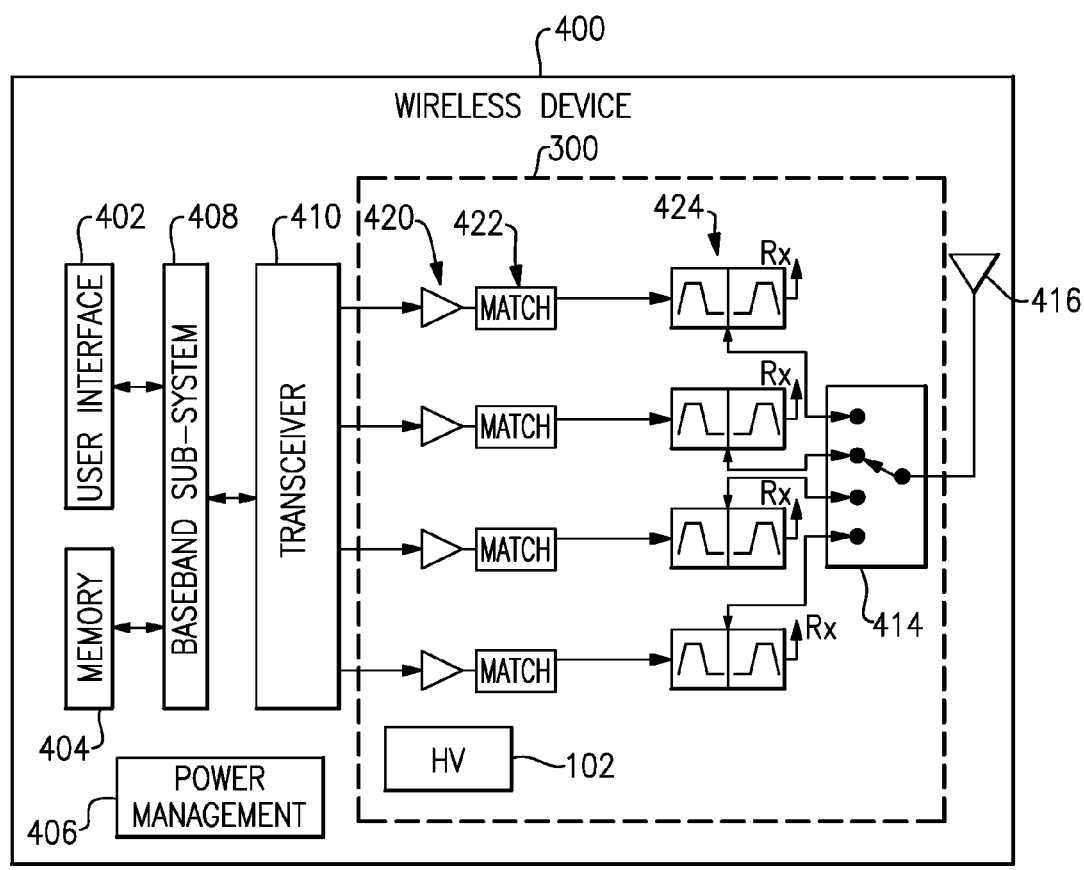
FIG. 15 depicts an example wireless device having one or more advantageous features described herein.

FIG. 15 depicts an example wireless device 400 having one or more advantageous features described herein. In the context of a module having one or more features as described herein, such a module can be generally depicted by a dashed box 300, and can be implemented as, for example, a front-end module (FEM).

Referring to FIG. 15, power amplifiers (PAs) 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 420. In some embodiments, the match circuit 422 can be the example matching circuits 172a-172c described herein in reference to FIG. 7. As also described herein in reference to FIG. 7, the outputs of the PAs 420 can be routed to their respective duplexers 424 without impedance transformation (e.g., with load transformation 116 in FIG. 6) when the PAs 420 are operated with HV supply. Such amplified and filtered signals can be routed to an antenna 416 through an antenna switch 414 for transmission. In some embodiments, the duplexers 420 can allow transmit and receive operations to be performed simultaneously using a common antenna (e.g., 416). In FIG. 15, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

As described herein, one or more features of the present disclosure can provide a number of advantages when implemented in systems such as those involving the wireless device of FIG. 15. For example, significant current drain reduction can be achieved through an elimination or reduction of output loss. In another example, lower bill of materials count can be realized for the power amplification system and/or the wireless device. In yet another example, independent optimization or desired configuration of each supported frequency band can be achieved due to, for example, separate PAs for their respective frequency bands. In yet another example, optimization or desired configuration of maximum or increased output power can be achieved through, for example, a boost supply voltage system. In yet another example, a number of different battery technologies can be utilized, since maximum or increased power is not necessarily limited by battery voltage.

One or more features of the present disclosure can be implemented with various cellular frequency bands as described herein. Examples of such bands are listed in Table 3. It will be understood that at least some of the bands can be divided into sub-bands. It will also be understood that one or more features of the present disclosure can be implemented with frequency ranges that do not have designations such as the examples of Table 3.

TABLE 3

| Band | Mode | Tx Frequency Range (MHz) | Rx Frequency Range (MHz) |
|---|---|---|---|
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
   a supply system configured to provide a high-voltage supply signal;
   a Doherty power amplifier including an input splitter configured to receive and split a signal into a carrier amplifier and a peaking amplifier, and a combiner configured to combine amplified signals from the carrier and peaking amplifiers to provide an output signal, the Doherty power amplifier configured to receive the high-voltage supply signal for operation of the carrier and peaking amplifiers; and
   an output path configured to couple the combiner to a filter, the Doherty power amplifier having an impedance substantially the same as an impedance of the filter when operated with the high-voltage supply signal.

2. The power amplification system of claim 1 wherein the supply system includes a boost DC/DC converter configured to generate the high-voltage supply signal based on a battery voltage.

3. The power amplification system of claim 1 wherein the impedance of the Doherty power amplifier has a value of approximately 50 Ohms.

4. The power amplification system of claim 1 wherein each of the carrier amplifier and the peaking amplifier includes a heterojunction bipolar transistor.

5. The power amplification system of claim 4 wherein the heterojunction bipolar transistor is implemented as a gallium arsenide device.

6. The power amplification system of claim 4 wherein the high-voltage supply signal is provided to a collector of the heterojunction bipolar transistor.

7. The power amplification system of claim 1 wherein the filter is a transmit filter configured to operate in a corresponding transmit frequency band.

8. The power amplification system of claim 7 wherein the transmit filter is part of a duplexer configured to operate in the transmit frequency band and a corresponding receive frequency band.

9. The power amplification system of claim 1 further comprising one or more additional Doherty power amplifiers, each configured to operate with the high-voltage supply signal.

10. The power amplification system of claim 9 further comprising an output path configured to couple each of the one or more additional Doherty power amplifiers to a filter, each additional Doherty power amplifier having an impedance substantially the same as an impedance of the respective filter when operated with the high-voltage supply signal.

11. The power amplification system of claim 10 wherein the power amplification system is substantially free of a band selection switch between the Doherty power amplifiers and the respective filters.

12. The power amplification system of claim 11 wherein the power amplification system has a lower loss than another power amplifier system having similar band handling capability but in which the Doherty power amplifiers are operated in low voltage.

13. A radio-frequency module comprising:
a packaging substrate configured to receive a plurality of components; and
a power amplification system implemented on the packaging substrate, and including a supply system configured to provide a high-voltage supply signal, the power amplification system further including a Doherty power amplifier having an input splitter configured to receive and split a signal into a carrier amplifier and a peaking amplifier, and a combiner configured to combine amplified signals from the carrier and peaking amplifiers to provide an output signal, the Doherty power amplifier configured to receive the high-voltage supply signal for operation of the carrier and peaking amplifiers, the power amplification system further including an output path configured to couple the combiner to a filter, the Doherty power amplifier having an impedance substantially the same as an impedance of the filter when operated with the high-voltage supply signal.

14. The radio-frequency module of claim 13 wherein the radio-frequency module is a front-end module.

15. The radio-frequency module of claim 13 wherein the power amplification system is substantially free of a band selection switch between the Doherty power amplifier and the filter.

16. The radio-frequency module of claim 15 wherein the power amplification system has a lower loss than another power amplifier system having similar band handling capability but in which a Doherty power amplifier is operated in low voltage.

17. The radio-frequency module of claim 15 wherein the radio-frequency module has an area that is significantly less than another radio-frequency module having an amplification system with an impedance transformation circuit and a band selection switch.

18. A wireless device comprising:
a transceiver configured to generate a signal;
a front-end module in communication with the transceiver, and having a power amplification system including a supply system configured to provide a high-voltage supply signal, the power amplification system further including a Doherty power amplifier having an input splitter configured to receive and split the signal into a carrier amplifier and a peaking amplifier, and a combiner configured to combine amplified signals from the carrier and peaking amplifiers to provide an output signal, the Doherty power amplifier configured to receive the high-voltage supply signal for operation of the carrier and peaking amplifiers, the power amplification system further including an output path configured to couple the combiner to a filter, the Doherty power amplifier having an impedance substantially the same as an impedance of the filter when operated with the high-voltage supply signal; and
an antenna in communication with the front-end module, and configured to transmit the output signal.

* * * * *